United States Patent [19]

Kobayashi et al.

[11] Patent Number: 4,837,131
[45] Date of Patent: Jun. 6, 1989

[54] DEVELOPING METHOD FOR PHOTOSENSITIVE MATERIAL

[75] Inventors: Kesanao Kobayashi; Hisao Ohba; Tadao Toyama, all of Shizuoka, Japan

[73] Assignee: Fuji Photo Film Co., Ltd., Minami-ashigara, Japan

[21] Appl. No.: 875,480

[22] Filed: Jun. 18, 1986

[30] Foreign Application Priority Data

Jun. 27, 1985 [JP] Japan ................................ 60-141339

[51] Int. Cl.$^4$ ................................................ G03F 7/08
[52] U.S. Cl. ............................... 430/302; 430/309; 354/297; 354/317; 354/322; 354/325
[58] Field of Search ..................... 430/302, 309, 326; 354/317, 325, 297, 322

[56] References Cited

U.S. PATENT DOCUMENTS

| | | | |
|---|---|---|---|
| 3,846,816 | 11/1974 | Gaisser | 354/307 |
| 3,903,541 | 9/1975 | Von Meister et al. | 354/317 |
| 3,961,101 | 6/1976 | Barton | 427/43 |
| 3,995,343 | 12/1976 | Horner | 354/297 |
| 4,212,935 | 7/1980 | Canavello et al. | 430/326 |
| 4,215,927 | 8/1980 | Grant et al. | 354/317 |
| 4,259,434 | 3/1981 | Yamasue et al. | 430/309 |
| 4,291,117 | 9/1981 | Ohishi et al. | 430/309 |
| 4,310,616 | 1/1982 | Hamada et al. | 430/309 |
| 4,464,035 | 8/1984 | Schoering | 354/299 |
| 4,469,776 | 9/1984 | Matsumoto et al. | 430/309 |
| 4,613,561 | 9/1986 | Lewis | 430/326 |

*Primary Examiner*—Charles L. Bowers, Jr.
*Attorney, Agent, or Firm*—Burns, Doane, Swecker & Mathis

[57] ABSTRACT

This invention provides a developing method for photosensitive materials, in particular for a positive photosensitive lithographic printing plate, which enables an efficient development with minimum consumption of the developing liquid. The developing method of the present invention comprises the steps of: conducting a preparatory development by applying a developing liquid to an exposed photosensitive layer of a photosensitive material, the developing liquid being supplied in an amount of necessary for each developing cycle; removing the developing liquid; discarding the developing liquid; and again applying a developing liquid to the photosensitive material to complete the development.

8 Claims, 1 Drawing Sheet

DEVELOPING METHOD FOR PHOTOSENSITIVE MATERIAL

BACKGROUND OF THE INVENTION (1) Field of the Invention

The present invention relates to a method of developing various photosensitive materials. More particularly, the invention is concerned with an automatic developing method for positive working photosensitive lithographic printing plates (2) Description of the Prior Art A method for developing a photosensitive lithographic printing plate (hereinafter referred to as "PS plate") by an automatic developing apparatus has been widely used. In this conventional method, an imagewise exposed PS plate which has been transferred to the developing section is dipped in a developing solution or the developing liquid is sprayed onto the surface of the photosensitive layer of the PS plate, while it is being conveyed, so as to dissolve or swell either the exposed or non-exposed region of the photosensitive layer, and then rubbing the photosensitive material with a brush in order to remove the non-image portion of the photosensitive layer In this method, a predetermined amount of the developing liquid is charged in the tank of the developing apparatus and recirculated by a pump so as to be used repeatedly, so that the developing ability of the developing liquid is gradually degraded with use. If the developing liquid is used too long, the ability of the developing liquid to dissolve the non-image portion of the photosensitive layer is impaired, resulting in "development failure". This development failure is attributable to the following reasons: namely, a phenomenon referred to as "processing exhaustion reduction" which is attributable to the consumption of the effective components in the developing liquid by the component eluted from the photosensitive layer; and a phenomenon called "secular exhaustion reduction" which is experienced when the developing liquid is an alkali solution, due to neutralization reaction caused by absorption of carbon dioxide gas in the air or, alternatively, experienced when the effective component of the developing agent is alcohol, due to evaporation of the latter.

In order to protect the developing liquid from processing exhaustion reduction and secular exhaustion reduction, methods have been proposed for continuously or intermittently supplying supplementary developing liquid in accordance with the processing rate, as described in Japanese Patent Application (OPI) No. 144502/1975 (the term "OPI" as used herein refers to a "published unexamined Japanese patent application"), U.S. Pat. No. 4,259,434 and British Pat. No. 2,046,931. In these methods, however, the composition of the developing liquid is inevitably changed from that of the initial or fresh developing liquid, although processing exhaustion reduction and secular exhaustion reduction are compensated for by the supply of the supplementary developing liquid. This means, in a strict sense, that the quality of the development differs in every developing cycle, with the result that the performance of the photosensitive material after the development does not become constant.

Another method is also known in which the developing liquid is supplied to an imagewise exposed photosensitive material in an amount required for each developing cycle, and the surface of the photosensitive material is rubbed with a brush or a sponge so that the nonimage region of the photosensitive layer is removed, as disclosed in, for example, U.S. Pat. No. 4,222,656. This method, however, causes incomplete development, so that the non-image portion is liable to be scummed during printing, even though the development appears to be satisfactory, particularly when this method is applied to the development of a PS plate.

SUMMARY OF THE INVENTION

Under such circumstances, the inventors found it possible to solve the above problems by employing process wherein development is conducted in two steps. In the first step, an amount of fresh developing liquid required for the developing cycle is applied to the exposed photosensitive layer of a photosensitive material so as to remove almost all of the non-image portion of the photosensitive layer by dissolving or swelling and then the developing liquid used in this step is discarded in order to eliminate any unfavourable effect which might otherwise be caused by repeated use of the developing liquid. In the second step the development is completed by contacting the exposed photosensitive layer with a fresh developing liquid.

It is therefore, a primary object of the present invention to provide a developing method for photosensitive materials which is capable of ensuring high and constant quality of the development.

Another object of the present invention is to provide a developing method which enables an efficient development with minimum consumption of the developing liquid, while eliminating the necessity for the renewal of the developing agent.

These and other objects of the present invention will be clear from the following description.

In accordance with the present invention, there is provided a developing method for a photosensitive material comprising the steps of: conducting a preparatory development by applying a developing liquid to an exposed photosensitive layer of the photosensitive material, the developing liquid being supplied in an amount necessary for each development cycle; removing the developing liquid; discarding the developing liquid; and again applying a developing liquid to the photosensitive material to complete the development.

DESCRIPTION OF THE PREFERRED EMBODIMENTS

Figure 1:
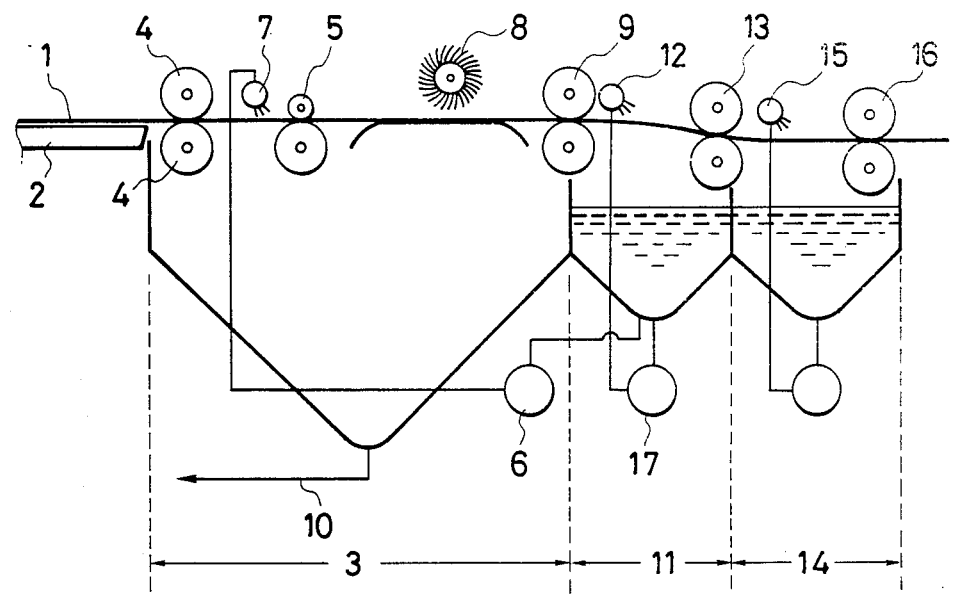
FIG. 1 is a schematic illustration of an apparatus suitable for use in carrying out the method of the invention.

The invention will be described hereinunder with reference to the case where a PS plate is used as a photosensitive material. The PS plate after imagewise exposure is introduced by a conveyor roller into a first developing zone where a developing liquid in the amount necessary for one developing cycle is applied to the exposed photosensitive layer of the PS plate. The term "amount required for one developing cycle" means an amount of the developing liquid which is necessary for almost complete development of the plate in 2 seconds to 2 minutes after application of the developing liquid to the exposed surface. When an ordinary PS plate is used, this amount is selected between 10 and 1,000 ml, preferably between 50 and 500 ml, per 1 m² of the photosensitive layer of an ordinary PS plate. The application of the developing liquid may be conducted in various means such as spraying device, wire bar, curtain coater, laberally movable dripping nozzle, and so forth. When the developing liquid is applied from the lower side, a roller or a gravure roll can be used suitably, though other means for application are also usable. In order to promote elution of the non-image portion of the photosensitive layer, the surface of the photosensitive layer may be rubbed with a brush roll, sponge roll or a raising roll. The rubbing is mandatory in the case of a PS plate of the type in which the non-image portion of the photosensitive layer is not dissolved but swelled by the developing liquid.

After the completion of the preparatory development, the photosensitive material, is passed through a nip between two rollers, whereby the developing liquid is removed. Alternatively, the non-image portion of the photosensitive layer and the developing liquid are effectively removed by scraping the surface of the photosensitive layer of the PS plate using, for example, a rubber blade.

Thus, almost all of the non-image portion of the photosensitive layer of the PS plate is removed in the first developing zone. The developing liquid used in the first developing zone is not used repeatedly but is discarded. Namely, fresh developing liquid is supplied for each development so that the quality of development is stabilized advantageously. In consequence, the photosensitive materials are processed uniformly. The PS plate after the preparatory development is then sent to the second developing zone.

In the next step conducted in the second developing zone, the first developing method may be repeated or a developing agent stored in a tank may be sprayed onto the surface of the photosensitive layer and used repeatedly. The development has been finished almost completely in the first developing zone, so that the liquid exhaustion in the second developing zone is small enough to permit the recirculation of the developing liquid. The second developing step can be effectively conducted even by dipping the photosensitive material in the developing liquid. Dipping minimizes the chance of contact with the ambient air as compared with the spraying. This in turn eliminates unstabilizing factors such as the liquid exhaustion by carbon dioxide in the air and concentration due to evaporation, with the result that the stability of the developing process is remarkably improved and the consumption of the developing liquid is reduced.

Therefore, both the cost of the developing liquid and the cost for the disposal of the developing liquid are lower than those in the conventional process which is constituted solely by repetitive use of developing agent stored in a tank. In the conventional process in which the same developing liquid is used repeatedly, all of the developing liquid stored in the tank has to be replaced with a fresh liquid after a predetermined amount of PS plates have been processed. The present invention completely eliminates the necessity for replacement of the liquid or at least greatly reduces the required frequency of replacement, whereby management of the developing liquid is facilitated.

Generally, in the development of a PS plate there has been encountered the problem that the component of the photosensitive layer in the non-image portion tends to remain in the recess of the grained surface of aluminum support. This component is liable to appear as a contamination in the non-image region when inking up the plate. In order to avoid this problem, hitherto, it has been recommended to use a large quantity of the developing liquid. According to the invention, the component of the photosensitive layer in the non-image portion is removed almost completely in the first developing step, and any residue in the recess of grain is removed in the second development. Since the amount of the residue is small, the degradation of the developing liquid is negligible, so that the PS plates developed by the method of the invention are constant in quality and suffer no contamination in the non-image portion.

The method of the invention can be carried out economically by arranging for the developing liquid used in the second developing zone to be supplied to the first developing zone and for fresh developing liquid to be supplied to the second developing zone to make up for the liquid sent to the first developing zone. Although the developing liquid used in the first developing zone should preferably be fresh, the developing liquid used in the second developing zone is subject to only a very low degree of degradation and can be used satisfactorily as the developing liquid for the first developing zone. In this embodiment, therefore, the developing liquid used in the second developing zone is sent to the first developing zone, and the fresh developing liquid is supplied to the second developing zone to make up for that sent to the first developing zone.

The PS plate after the completion of the second development may be further subjected to a rinsing with water and taken out after treatment by a finisher or a gum. The rinsing water may be recirculated for repeated use. The rinsing with water, however, is not essential and may be omitted.

As has been described, the developing method of the invention produces the most remarkable results when applied to PS plates. A description will be made hereinunder regarding the case where the photosensitive material is the PS plate and the developing liquid is one suitable for the method of the invention. The PS plate is basically composed of a support having a hydrophilic surface on which is formed a photosensitive layer of which solubility to the developing agent or swelling in the developing liquid is changed in response to the exposure.

According to the invention, aluminum is preferably used as the material of a support. The surface of the support is preferably treated by, for example, graining, dipping in an aqueous solution of, for example, sodium silicate, potassium zirconate fluoride, phosphate and so forth, or anodic oxidation treatment. An aluminum support disclosed in U.S. Pat. No. 3,181,461, in which an anodized aluminum plate is dipped in an aqueous solution of a silicate of an alkali metal, as well as an aluminum support grained by mechanical or electrolytic graining processes as disclosed in U.S. Pat. No. 4,476,006, can be used suitably in the invention. The anodic oxidation is preferably effected by flowing a current through an electrolyte of aqueous solutions or non-aqueous solutions of inorganic acids such as phosphoric acid, chromic acid, sulfuric acid, boric acid and so forth, or an organic acid such as oxalic acid, sulfamic acid and so forth, or their salts, with an aluminum plate immersed in the electrolyte.

Preferably, a sealing treatment is effected to the grained and anodized aluminium plate. The sealing treatment is carried out by dipping in an aqueous solution of sodium silicate, hot water or a hot aqueous solution of an organic or inorganic solution or, alternatively, by steam bathing.

A silcate electro-deposition as disclosed in U.S. Pat. No. 3,658,662 is also effective.

Typical examples of the photosensitive composition suitable for constituting a photosensitive layer on the support are as follows:

(1) Composition comprising photosensitive diazo resin and a binder:

Preferred examples of the diazo resin are hexafluoro phosphate, tetrafluoro borate and phosphate of a condensate between P-diazodiphenyl amine and formaldehyde or acetoaldehyde. The following photosensitive diao resin disclosed in U.S. Pat. No. 3,300,309 are preferably used as the photosensitive diazo resin in the present invention: the salts of the condensation products of p-diazodiphenylamine and formaldehyde or acetsaldehyde, the specific salts being a sulfonate such as p-toluene sulfonate, and 2-methoxy-4-hydroxy-5-beizoil benzene sulfonate, phosphinate such as benzene phosphinate, salts of compounds having hydroxy group, e.g., 2,4-dihydroxy benzophenon salt, and carboxylate.

Mesitylene sulfonate of a diazo resin which is obtained through condensation of 3-methyoxy-4-diazo-diphenyl amine by 4,4'-bis-methoxy-methyl-diphenyl ether, which is shown in Japanese Patent Application (OPI) No. 27141/1983, can also be used suitably as the photosensitive diazo resin.

As to the binder, various polymeric compounds can be used, but polymers having a hydroxy group, amino group, carbonate group, amide group, sulfon amide group, active methylene group, thioalcohol group and/or epoxy group are preferably used.

Examples of binders that can be suitably used include shellac as disclosed in British Patent No. 1,350,521; polymers having hydroxy ethyl acrylate unit or hydroxy ethyl methacrylate unit as the recurring units, as disclosed in British Patent Nos. 1,460,978 and 1,505,739; polyamide resins disclosed in U.S. Pat. No. 3,751,257; phenol resins and polyvinyl acetal resins, e.g., polyvinyl formal resin and polyvinyl butyral resin, which are disclosed in British Pat. No. 1,074,392; and linear polyurethane resins as disclosed in U.S. Pat. No. 3,660,097, phthalate resin of polyvinyl alcohol, epoxy resin condensed from bisphenol A and epiclorhydrin, polymers having amino group such as polyamino stylene or polyalkyl amino (metha) acrylate, cellulose such as acetate cellulose, cellulose alkyl ether, cellulose acetate phthalate.

An additive such as phosphoric acid, dyestuff or the like as disclosed in U.S. Pat. No. 3,236,646, as well as a pH indicator as disclosed in British Pat. No. 1,041,463, may be added to the composition composed of the diazo resin and the binder.

(2) Photosensitive layer comprising o-quinonediazide compound:

Preferred o-quinonediazide compounds are o-naphthoquinonediazide compounds and they are described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,647,443 as well as other many publications. Among these compounds, the o-naphthoquinonediazidosulfonic acid esters or o-naphthoquinonediazidocarboxylic acid esters of aromatic hydroxy compounds and o-naphthoquinonediazidosulfonic acid amides or o-naphthoquinonediazidcarboxylic acid amides of aromatic amino compounds are particularly preferred. In particular, the esterification product of onaphthoquinonediazidosulfonic acid and the condensation product of pyrogallol and acetone described in U.S. Pat. No. 3,635,709; the esterification product of a polyester having a terminal hydroxy group and o-naphthoquinonediazidosulfonic acid or o-naphthoquinonediazidocarboxylic acid described in U.S. Pat. No. 4,028,111; the esterification product of a homopolyrem of p-hydroxystyrene or a copolymer thereof and other copolymerizable monomers and onaphthoquinonediazidosulfonic acid or o-naphthoquinonediazidocarboxylic acid as described in British Pat. No. 1,494,043; and the amido reaction product of a copolymer of p-aminostyrene and other copolymerizable monomer and onaphthoquinonediazidosulfonic acid or o-naphthoquinonediazidocarboxylic acid described in U.S. Pat. No. 3,759,711 are excellent.

These o-quinonediazide compounds may be used alone but they are preferably used together with an alkali-soluble resin. Preferred alkali-soluble resins are novolak-type phenol resins. Practically, there are phenol/formaldehyde resins, o-cresol/formaldehyde resins, and m-cresol/formaldehyde resins. Furthermore, as is described in U.S. Pat. No. 4,123,279, it is more preferred to use the above-described phenol resins together with a condensation product of formaldehyde and a phenol or cresol substituted by an alkyl group having 3 to 8 carbon atoms, such as a t-butylphenol formaldehyde resin. The content of the alkali-soluble resin is from about 50 to about 85% by weight, preferably from about 60 to 80% by weight based on the total weight of the composition constituting the photosensitive layer.

The photosensitive composition comprising the o-quinonediazide compound may, if necessary, contain additives such as dyes, plasticizers, and the components for imparting print out faculty as described in, for example, British Pat. Nos. 1,041,463 and 1,039,475 and U.S. Pat. No. 3,969,118.

(3) Photosensitive layer comprising an azide compound and binder (polymer):

As the photosensitive compositions for the photosensitive layer, there are the compositions comprising azide compounds and water-soluble or alkali-soluble polymers described in, for example, British Pat. Nos. 1,235,281 and 1,495,861 and Japanese Patent Application (OPI) Nos. 32331/76 and 36128/76 as well as the compositions comprising polymers having azide groups and polymers as binders described in Japanese Patent Application (OPI) Nos. 5102/75, 84302/75, 84303/75 and 12984/78.

(4) Composition containing a compound capable of crosslinking upon irradiation with activating light:

Such compounds include, among others, polyvinyl cinnamate, polyvinyl cinnamoyl ethyl ether, polyethtyl cinnamate acrylate and copolymers thereof, polyethyl cinnamate methacrylate and copolymers thereof, polyparavinylphenyl cinnmate and copolymers thereof, polyvinyl benzal acetophenone and derivatives thereof, polyvinyl cinnamylideneacetate and derivatives thereof, allyl acrylate prepolymer and derivatives thereof, and derivatives of polyester resins from paraphenylene-diacrylic acid and a polyhydric alcohol, such as described in U.S. Pat. No. 3,030,208.

(5) Photopolymerizable composition capable of polymerizing upon irradiation with activating light:

Such compositions include, for example, a composition comprising an unsaturated compound having two or more terminal ethylene groups and capable of addition polymerization, polymer binder and a photopolymerization initiator, such as described in U.S. Pat. Nos. 2,760,863; 3,060,023 and 4,072,528.

To the above-mentioned compound capable of crosslinking or polymerizing under activating light irradiation, there may further be added a resin (as a binder), sensitizer, thermal polymerization inhibitor, colorant and/or plasticizer.

Examples of the developing liquid suitable for use in the development of image on a photosensitive layer of above mentioned composition (1) include an aqueous solution of a weak alkali comprising an organic solvent having a low solubility in water, an alkali agent, and an anion surfactant such as aromatic sulfonate, dialkylsulfosuccinate, naphthalene alkylsulfonate, salt of sulfate ester of an adduct formed by adding ethylene oxide to naphthol, branched alkyl sulfate ester salt and so forth. These liquids are disclosed in Japanese Patent Application (OPI) Nos. 77401/1976 and 80228/1976, and U.S. Pat. No. 4,186,006.

For the development of an image on a PS plate having the photosensitive layer of the composition (2), it is preferable to use an aqueous solution of a silicate of an alkali metal. Details regarding such an aqueous solution is disclosed in U.S. Pat. No. 4,259,434.

The developing method of the invention can be applied equally well to other types of photosensitive materials such as photosensitive resin plates, printed circuit boards formed by the use of a photoresist, silver-salt film, non-silver-salt film and so forth.

The present invention will be explained hereinafter with non-limitative examples.

EXAMPLE 1

A photosensitive liquid was prepared by dissolving 1 weight part of naphthoquinone-1,2-diazido-5-sulfonate ester of polyhydroxyphenyl which is a condensate of acetone and pyrogallol disclosed in U.S. Pat. No. 3,635,709, 2 weight parts of novolak type phenolformaldehyde resin, and 0.02 weight part of crystalviolet, in a solution consisting of 20 weight parts of ethylene glycol monomethyl ether acetate, 10 weight parts of ethylene glycol monomethyl ether and 10 weight parts of methyl ethyl ketone. On the other hand, a 0.3 mm thick grained aluminum plate was subjected to anode oxidation in sulfuric acid to have an oxide film formed thereon at the rate of about 2.4 g/m$^2$. Then, the above-mentioned photosensitive liquid was applied to the oxide film, whereby a photosensitive plate having about 2.5 g/m$^2$ photosensitive layer was obtained.

Thus obtained positive working photosensitive printing plate was exposed for 60 seconds by a 3 kW metal halide lamp which was spaced 1 m from the printing plate, through a positive transparency.

The exposed photosensitive plate was subjected to development using developing apparatus as shown in FIG. 1:

More specifically, the exposed photosensitive printing plate 1 was introduced into the first developing zone 3 by a feeder 2 and brought into the nip between feed rolls 4,4. The presence of the photosensitive printing plate 1 was detected by a sensor (not shown) which was incorporated in the carrier 2. The pump 6 started to operate immediately before the leading end of the photosensitive printing plate 1 came into contact with the wire rod 5, so that a suitable amount of developing liquid was sprayed from a sprayer 7 so as to be spread over the photosensitive layer of the photosensitive printing plate. The developing liquid was then applied uniformly by a wire load coater 5. Then, after being rubbed by a brush roller 8, the printing plate was nipped between a pair of rollers 9. The developing liquid used in the first developing zone was collected in a waste liquid reservoir (not shown) through a pipe 10. After the development, the printing plate was introduced into a second developing zone 11 in which pumped-up developing liquid was sprayed from a sprayer 12, thereby ensuring completion of the development. The printing plate was then nipped by rollers 13 and introduced into a finisher zone 14 where a finisher was sprayed thereon from a sprayer 15. After the developing liquid on the had been replaced by the finisher, the printing plate was taken out by rollers 16. The thus processed printing plate will be referred to as "sample A", hereinunder. In the first developing zone, the developing liquid was consumed at the rate of 100 ml per 1 m$^2$ of the photosensitive material. The composition of the developing liquid was 3 wt % aqueous solution of potassium silicate (SiO$_2$/K$_2$O=1.24).

On the other hand, a comparison example B of the processed printing plate was prepared by the same apparatus as that shown in FIG. 1, except that the pump 17 was not operated.

These two printing plates were set together on a Hamada printing machine and subjected to a test printing. It will be seen that with the limits of tolerable contamination the printing plate A developed by the method of the invention permitted a wider selection of printing conditions than the printing plate B developed by the conventional method. Namely, the printing plate A developed by the method of the invention showed a smaller tendency to be contaminated at the non-image portion, even when the rate of supply of fountain was decreased. This means that the printing plate A had a wider printing latitude. In addition, the printed matter printed by the printing plate A showed a greater lust, by virtue of reduced amount of fountain solution.

EXAMPLE 2

Figure 2:
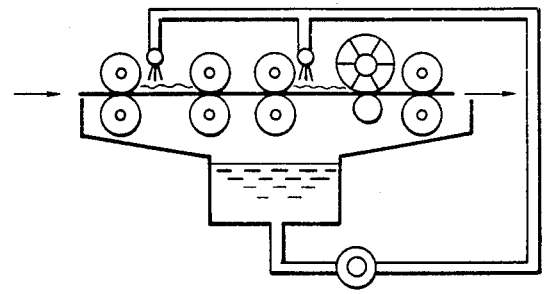
FIG. 2 is a schematic illustration of a conventional developing apparatus.

50 sheets of imagewise exposed photosensitive printing plates (plate size 1003×800 mm) were developed in the same way as Example 1. Another 50 sheets of imagewise exposed photosensitive printing plates were developed in a widely used automatic developing machine of the type in FIG. 2 which had been charged with 10 liters of developing liquid. In the case of the second 50 printing plates developed by the automatic developing machine shown in FIG. 2, the first printing plate showed the widest water/ink balance and, hence, the smallest tendency of contamination. The water/ink balance became narrower as the number of the processed plates was increased. The printing plates after 40th exhibited substantial color stain in the non-image portion and provided printed matters with the contamination in the non-image portion when an ordinary rate of fountain solution was supplied. In contrast, in the case of the first 50 printing plates developed by the method of the invention, all the printing plates showed superior water/ink balance and no fluctuation was observed in the color of the non-image portion.

As in obvious from the above description, according to the invention, it is possible to automatically develope images on various photosensitive materials at a high quality and with minimum fluctuation in quality. Amount of wasted developing solution can also be reduced, so that it results in low cost and high utility of the developing method.

What is claimed is:

1. A developing method for a photosensitive lithographic printing plate comprising a support having a photosensitive layer thereon, said photosensitive layer containing a photosensitive diazo resin or a photosensitive o-quinone diazide compound, which method comprises th steps of, in order, (i) preparatively developing for 2 seconds to 2 minutes the photosensitive lithographic printing plate which has been imagewise exposed to light with a developing liquid supplied to the plate in an amount from 10 to 1,000 ml/m$^2$ of the photosensitive layer and rubbing the surface of the photosensitive layer to promote the elution of the non-image portion of the photosensitive layer after application of the developing liquid, thereby removing almost all of the non-image portion of the photosensitive layer of the plate, (ii) discarding the developing liquid used in the preparatory development of step (i), and (iii) developing the photosensitive layer of said printing plate with a developing liquid which has not been used previously in a preparatory development step (i) in order to complete development, wherein said developing liquid used in step (iii) is also used for the step (i) development of subsequently processed plates.

2. A developing method as set forth in claim 1, wherein the developing liquid in the preparatory development is applied to the photosensitive lithographic printing plate in amount between 50 and 500 ml per 1 m$^2$ of the photosensitsive layer.

3. A developing method as set forth in claim 1, wherein the developing after the preparatory development is conducted by dipping the photosensitive lithographic printing plate in the developing liquid.

4. A developing method as set forth in claim 1, wherein the developing liquid used in the step (iii) development is recycled for use in the step (i) preparatory development.

5. A developing method as set forth in claim 1, wherein the photosensitive lithographic printing plate after completion of the step (iii) development is subjected to a rinsing with water and to a finisher treatment or a gumming treatment.

6. A developing method as set forth in claim 1, wherein the photosensitive layer comprises an o-naphthoquinone diazide compound and a novolak-type phenol resin.

7. A developing method as set forth in claim 6, wherein the developing liquid is an aqueous solution of an alkali-metal silicate.

8. A developing method as set forth in claim 1, wherein the said photosensitive layer comprises a photosensitive diazo resin and a binder-polymer having at least one functional group selected from the group consisting of a hydroxy group, a amino group, a carbonate group, an amide group, a sulfone amide group, an active methylene group, a thioalchohal group and an apoxy group.

* * * * *